US009680299B2

United States Patent
Tanaka et al.

(10) Patent No.: US 9,680,299 B2
(45) Date of Patent: Jun. 13, 2017

(54) BATTERY PROTECTION INTEGRATED CIRCUIT, BATTERY PROTECTION APPARATUS AND BATTERY PACK

(71) Applicants: Nobuhito Tanaka, Tokyo (JP); Norihito Kawaguchi, Tokyo (JP)

(72) Inventors: Nobuhito Tanaka, Tokyo (JP); Norihito Kawaguchi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/857,899

(22) Filed: Sep. 18, 2015

(65) Prior Publication Data
US 2016/0359321 A1    Dec. 8, 2016

(30) Foreign Application Priority Data

Jun. 4, 2015  (JP) ................................. 2015-114018

(51) Int. Cl.
| | |
|---|---|
| *H02H 9/02* | (2006.01) |
| *H02J 7/00* | (2006.01) |
| *H01M 2/34* | (2006.01) |
| *H01M 10/0525* | (2010.01) |
| *H02H 7/18* | (2006.01) |
| *H05K 1/02* | (2006.01) |

(52) U.S. Cl.
CPC .............. *H02H 9/025* (2013.01); *H01M 2/34* (2013.01); *H01M 10/0525* (2013.01); *H02H 7/18* (2013.01); *H02J 7/0031* (2013.01); *H05K 1/02* (2013.01); *H01M 2200/00* (2013.01)

(58) Field of Classification Search
CPC ... H02H 9/025; H01M 10/0525; H02J 7/0031
See application file for complete search history.

(56) References Cited

U.S. PATENT DOCUMENTS

| | | | | |
|---|---|---|---|---|
| 2004/0012369 A1* | 1/2004 | Moore | ................ | B60L 11/1851 320/104 |
| 2005/0285571 A1* | 12/2005 | Grunert | ............. | H01M 10/4207 320/128 |
| 2011/0267726 A1* | 11/2011 | Ikeuchi | ................. | H01M 10/44 361/63 |

FOREIGN PATENT DOCUMENTS

| | | |
|---|---|---|
| JP | 2006-208152 | 8/2006 |
| JP | 5205368 | 6/2013 |

OTHER PUBLICATIONS

Japanese Office Action mailed Aug. 18, 2015.

* cited by examiner

*Primary Examiner* — Thienvu Tran
*Assistant Examiner* — Tien Mai
(74) *Attorney, Agent, or Firm* — IPUSA, PLLC (57) ABSTRACT

A battery protection integrated circuit includes a switch unit; a control unit that controls on and off of the switch unit based on a monitored result; a package; a plurality of external connection terminals that are electrically connected to a plurality of terminal portions of the switch unit and the control unit, respectively, all of the external connection terminals that are to be connected to a first terminal of a circuit board being provided at a first short side of the terminal providing surface that faces one of board short sides of a circuit board, and all of the external connection terminals that are to be connected to a second terminal of the circuit board being provided at a second short side that is opposite to the first short side, when being mounted on the circuit board.

14 Claims, 4 Drawing Sheets

| TERMINAL No. | NAME | FUNCTION |
|---|---|---|
| 1 | S1 | DISCHARGE FET SOURCE TERMINAL |
| 2 | VSS | MINUS SIDE POWER SOURCE INPUT TERMINAL |
| 3 | VPP | PROGRAM POWER SOURCE TERMINAL |
| 4 | VDD | PLUS SIDE POWER SOURCE INPUT TERMINAL |
| 5 | V− | BATTERY CHARGER MINUS POTENTIAL INPUT TERMINAL |
| 6 | S2 | CHARGE FET SOURCE TERMINAL |
| 7 | D | DISCHARGE FET DRAIN AND CHARGE FET DRAIN TERMINAL |

FIG.7

BATTERY PROTECTION INTEGRATED CIRCUIT, BATTERY PROTECTION APPARATUS AND BATTERY PACK

CROSS-REFERENCE TO RELATED APPLICATION

The present application is based on and claims the benefit of priority of Japanese Priority Application No. 2015-114018 filed on Jun. 4, 2015, the entire contents of which are hereby incorporated by reference.

BACKGROUND OF THE INVENTION

1. Field of the Invention

The present invention relates to a battery protection integrated circuit, a battery protection apparatus and a battery pack.

2. Description of the Related Art

Conventionally, a battery protection IC is known that is used by being mounted on a circuit board wherein the circuit board is used by being attached to a side surface of a battery having a flat rectangular parallelepiped outer shape (see Patent Document 1, for example). Such a battery protection IC includes a plurality of external connection terminals provided to be positioned along a longitudinal direction of a rectangular circuit board when being mounted on the rectangular circuit board.

However, in the above described conventional technology, as a wiring pattern that is connected to the external connection terminal at a center portion, among the plurality of external connection terminals that are provided along the longitudinal direction, needs to extend below the IC, the thermal conductivity of the wiring pattern is lowered. Thus, wettability of solder between the external connection terminal at the center portion and the wiring pattern tends to be lowered.

PATENT DOCUMENT

[Patent Document 1] Japanese Patent No. 5,205,368

SUMMARY OF THE INVENTION

The present invention is made in light of the above problems, and provides a battery protection integrated circuit, a battery protection apparatus and a battery pack in which wettability of solder of an external connection terminal does not tend to be lowered.

According to an embodiment, there is provided a battery protection integrated circuit that is used by being mounted on a circuit board, the circuit board being used by being attached to a side surface of a battery having a flat rectangular parallelepiped outer shape, the circuit board having a long and thin rectangular shape corresponding to the shape of the side surface of the battery, the circuit board at least including a first terminal connected to one terminal of the battery, a second terminal connected to one terminal of a battery charger or an electronic device, the battery protection integrated circuit being configured to control, when being mounted on the circuit board, current that flows between a current path of charge and discharge between the first terminal and the second terminal of the circuit board. The battery protection integrated circuit includes a switch unit that switches on and off the current path; a control unit that monitors a status of the battery and controls on and off of the switch unit based on the monitored result; a package that covers the switch unit and the control unit; a plurality of external connection terminals that are electrically connected to a plurality of terminal portions of the switch unit and the control unit, respectively, and are provided to expose at a terminal providing surface of the package, the terminal providing surface being configured to face the circuit board, the terminal providing surface having a rectangular shape shorter than the length of the circuit board in a longitudinal direction of the circuit board and shorter than the length of the circuit board in a short direction of the circuit board, all of the external connection terminals that are to be connected to the first terminal being provided at a first short side of the terminal providing surface that faces one of board short sides of the circuit board, and all of the external connection terminals that are to be connected to the second terminal being provided at a second short side that is opposite to the first short side, when being mounted on the circuit board. Further, in the battery protection integrated circuit, the control unit includes a nonvolatile memory, the one terminal of the battery is a minus terminal of the battery, and the all of the external connection terminals that are to be connected to the first terminal includes a terminal for writing data in the nonvolatile memory.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

Figure 1:
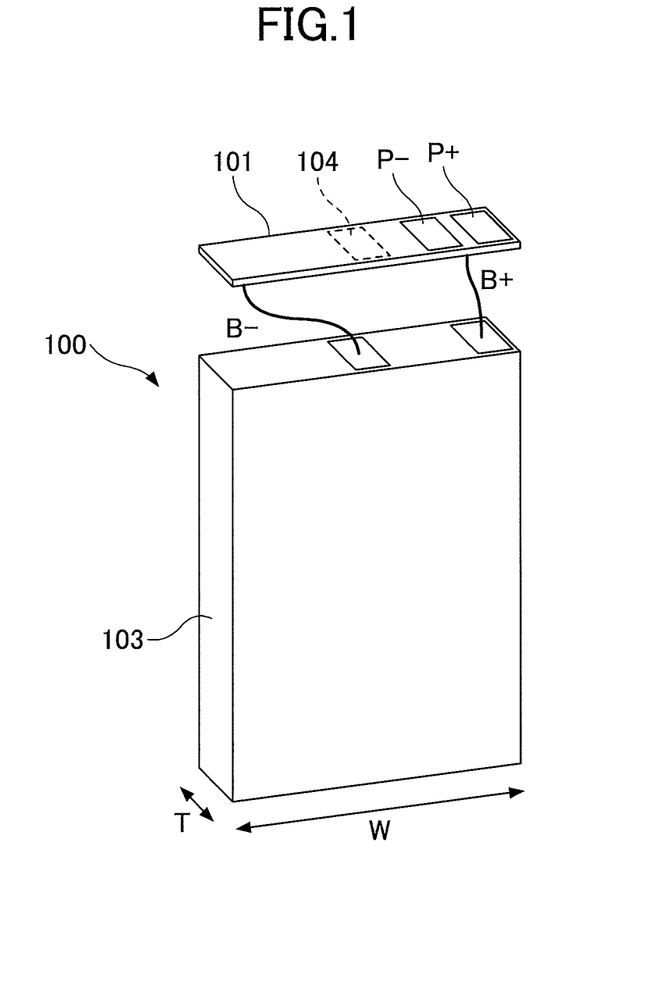
FIG. 1 is a perspective view illustrating an example of a battery pack.

FIG. 1 is a perspective view illustrating an example of a lithium-ion secondary battery pack 100. As illustrated in FIG. 1, the lithium-ion secondary battery pack 100 includes a lithium-ion secondary cell 103 (battery), a circuit board 101, and a battery protection integrated circuit 104 mounted on the circuit board 101.

The lithium-ion secondary cell 103 has a flat rectangular parallelepiped shape with a width W between 25 mm to 40 mm and a thickness T between 2 mm to 6 mm, for example.

The circuit board 101 is formed to have an elongate shape corresponding to a side surface shape of the lithium-ion secondary cell 103. A plus terminal (B+) and a minus terminal (B−) are formed at both end portions of a mounting surface of the circuit board 101 on which the battery protection integrated circuit 104 is mounted. These terminals are respectively connected to a plus terminal (B+) and a minus terminal (B−) of the lithium-ion secondary cell 103.

The battery protection integrated circuit 104 that monitors and protects overcharge or the like to the lithium-ion secondary cell 103 is mounted at a center portion of the mounting surface of the circuit board 101. The battery protection integrated circuit 104 is used by being mounted on the circuit board 101 and the circuit board 101 is used by being attached on the side surface of the cell 103.

Meanwhile, a plus terminal (P+) and a minus terminal (P−) are formed at a back surface of the circuit board 101, and these terminals are connected to a battery charger or an electronic device or the like that uses electric power of the cell 103. The plus terminal (P+) is provided to overlap the plus terminal (B+) of the circuit board 101 in a plan view, and is electrically connected to the plus terminal (B+) of the circuit board 101 via a conductive member that is provided to penetrate the circuit board 101. As the circuit board 101 thus configured is integrally packed with the lithium-ion secondary cell 103, it is necessary for the circuit board 101 to have a size that matches the side surface of the lithium-ion secondary cell 103. For the example of FIG. 1, the circuit board 101 needs to have a thickness T: 2 mm to 6 mm, width W: 25 mm to 40 mm, for example.

Figure 2:
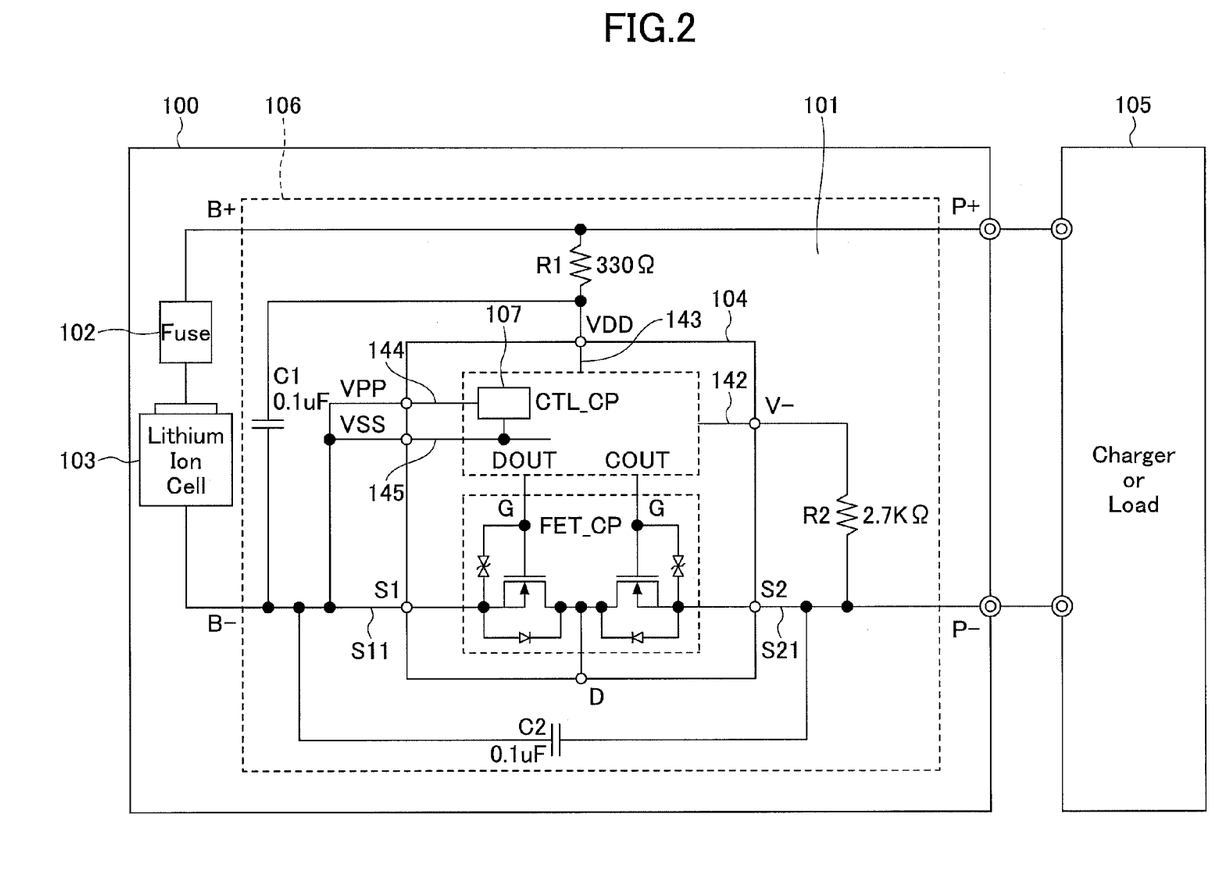
FIG. 2 is a schematic view illustrating an example of a battery control system including the battery pack of the embodiment.

FIG. 2 is a schematic view illustrating an example of a battery control system including the battery pack 100 of the embodiment. The battery control system illustrated in FIG. 2 includes the battery pack 100 and a battery charger 105 (or a load) that is used when charging (or discharging) the cell 103.

The battery pack 100 (a lithium-ion secondary battery pack, for example) includes the lithium-ion secondary cell 103 (a battery), a fuse 102 and a battery protection apparatus 106.

The battery protection apparatus 106 includes the circuit board 101 and the battery protection integrated circuit 104 as illustrated in FIG. 1 and is integrally packed as the battery pack 100 with the cell 103 and the fuse 102.

The battery protection apparatus 106 includes the circuit board 101 on which a circuit portion surrounded by a large dashed line. As illustrated in FIG. 1 as well, the circuit board 101 includes the plus terminal (B+) that is connected to a plus terminal side of the cell 103, the minus terminal (B−) that is connected to a minus terminal side of the cell 103, the plus terminal (P+) that is connected to a plus terminal side of the battery charger 105 and the minus terminal (P−) that is connected to a minus terminal side of the battery charger 105. Further, various resistance elements R1 and R2, various capacitance elements C1 and C2 are mounted on the circuit board 101 in addition to the battery protection integrated circuit 104.

The battery protection integrated circuit 104 has a structure in which a control chip CTL_CP and an FET chip FET_CP that is composed by power MOSFETs (Metal Oxide Semiconductor Field Effect Transistor) or the like are packed in a single package (a resin sealing body, for example).

The battery protection integrated circuit 104 includes 7 terminals S1, S2, VDD, VPP, VSS, V− and D as external connection terminals, for example. The terminal S1 is connected to the minus terminal (B−) via a conductive region S11 of a conductive layer (wiring layer) provided on the circuit board 101 by being connected to the conductive region S11. The terminal S2 is connected to the minus terminal (P−) via a conductive region S21 of a conductive layer (wiring layer) provided on the circuit board 101 by being connected to the conductive region S21. The terminal VDD is connected to the plus terminal (B+) and the plus terminal (P+) that are commonly connected on the circuit board 101 via the resistance element R1. The terminal VSS and the terminal VPP are connected to the minus terminal (B−) with the terminal S1. The terminal V− is connected to the minus terminal (P−) via the resistance element R2. The terminal D is extended from a drain of the FET chip FET_CP, which will be explained later, and is provided for testing the battery protection integrated circuit 104.

The battery protection integrated circuit 104 is configured, when being mounted on the circuit board 101, to control a current that flows through a current path of charge and discharge between the minus terminal (B−) of the circuit board 101 and the minus terminal (P−) of the circuit board 101.

The FET chip FET_CP functions as a switch unit that switches on and off the current path between the minus terminal (B−) at the cell 103 side and the minus terminal (P−) at the battery charger 105 side. The FET chip FET_CP includes two MOSFETs whose drains are commonly connected, and a source of one of the MOSFETs is electrically connected to the terminal S1 and a source of the other of the MOSFETs is electrically connected to the terminal S2. Each of the MOSFETs includes a body diode in which a drain functions as a cathode. Thus for each of the MOSFETs, on and off is individually controlled by the control chip CTL_CP, and it is capable of setting capable of charging, capable of discharging, capable of charging and discharging and incapable of charging and discharging.

The control chip CTL_CP includes terminals DOUT and COUT that are connected to gates of the MOSFETs, respectively, in the package of the battery protection integrated circuit 104 and is an example of a control unit that controls on and off of each of the MOSFETs. The control chip CTL_CP includes a current monitor terminal portion 142 that is electrically connected to the terminal V−, monitors the status of a current value of charge and/or discharge of the cell 103 by the terminal V−, and controls on and off of each of the MOSFETs based on the monitored result. The control chip CTL_CP further includes a voltage monitor terminal portion 143 that is electrically connected to the terminal VDD, monitors the status of a voltage value of the cell 103 by the terminal VDD, and controls on and off of each of the MOSFETs based on the monitored result.

The control chip CTL_CP further includes a ground input terminal portion 145 that is electrically connected to the terminal VSS. Here, the control chip CTL_CP is operated by the terminal VDD and the terminal VSS as a power source. As the terminal VSS is commonly connected with the terminal S1 on the circuit board 101, the terminal VSS may be commonly provided with the terminal S1 in the battery protection integrated circuit 104. However, in order to individually test the control chip CTL_CP and the FET chip FET_CP before mounting the battery protection integrated circuit 104 on the circuit board 101, it is preferable that the terminal VSS and the terminal S1 are individually provided in the battery protection integrated circuit 104 and are commonly connected on the circuit board 101. This means that when testing the battery protection integrated circuit 104, it is possible to control the voltage between the source-drain of the MOSFET by the terminals S1 and S2 and the terminal D, and to control the voltage between the gate-source of the MOSFET by the voltages of the internal terminals DOUT and COUT generated by the terminal VSS and the terminal VDD and a difference in electric potential between the terminals S1 and S2. For example, if the terminal VSS and the terminal S1 are commonly provided in the package of the battery protection integrated circuit 104, only a fixed value can be set for the voltage between the gate-source of the MOSFET.

The control chip CTL_CP includes a memory power source terminal portion 144 that is electrically connected to the terminal VPP, and a nonvolatile memory 107 that is connected to the terminal VPP via the memory power source terminal portion 144. The memory 107 is an example of a nonvolatile memory in which parameter data can be written that defines specification of the battery protection integrated circuit 104 by writing voltage input to the terminal VPP, for example.

As a specific example of the memory 107, an OTPROM (One Time Programmable ROM), an EEPROM (Electrically Erasable Programmable ROM) or the like may be raised. The control chip CTL_CP is an example of a protection operation circuit that performs a protection operation of the cell 103 based on the parameter data read out from the memory 107. The control chip CTL_CP performs the protection operation of the cell 103 by generating a signal that controls on and off of the current path between the minus terminal (B−) and the minus terminal (P−) based on a monitored result of the status of the cell 103, for example.

As a specific example of the parameter data, threshold voltage data for setting such as an overcharge detection voltage Vdet1, an overcharge restoration voltage Vrel1, an overdischarge detection voltage Vdet2, an overdischarge restoration voltage Vrel2, a discharge overcurrent detection voltage Vdet3, a charge overcurrent detection voltage Vdet4, a short-circuit detection voltage Vshort, a stand-by threshold voltage Vstb or the like may be raised. Further, as a specific example of the parameter data, delay time data for setting such as an overcharge detection delay time tVdet1, an overcharge restoration delay time tVrel1, an overdischarge detection delay time tVdet2, an overdischarge restoration delay time tVrel2, a discharge overcurrent detection delay time tVdet3, a discharge overcurrent restoration delay time tVrel3, a discharge overcurrent detection delay reset time tVd3*rst*, a charge overcurrent detection delay time tVdet4, a charge overcurrent restoration delay time tVrel4, a short-circuit detection delay time tshort or the like may be raised.

For example, the control chip CTL_CP performs an operation to protect the cell 103 from overcharge (overcharge protection operation), for example. The control chip CTL_CP monitors the battery voltage (cell voltage) of the cell 103 by detecting a voltage between the terminal VDD and the terminal VSS. The control chip CTL_CP detects overcharge of the cell 103 when detecting that the cell voltage is greater than or equal to the overcharge detection voltage Vdet1 that is set in accordance with the threshold voltage data read out from the memory 107.

The control chip CTL_CP performs an overcharge protection operation by outputting a low level control signal by which the MOSFET for controlling charging is switched off from the terminal COUT after waiting for overcharge detection delay time tVdet1 to pass that is set in accordance with delay time data read out from the memory 107. By switching of the MOSFET for controlling charging, overcharge of the cell 103 can be prevented regardless of the on and off status of the MOSFET for controlling discharging.

Similar to the above case, the control chip CTL_CP uses other threshold voltage data or delay data when performing the protection operation of the cell 103.

Thus, it is possible to change the protection operation of the cell 103 by changing the parameter data to be written in the memory 107. Therefore, the battery protection integrated circuit 104 can correspond to a plurality of different specification with the same circuit structure. For example, even when kinds of the cells 103, kinds of products on which the battery protection integrated circuit 104 is mounted are different, the hardware structure of the battery protection integrated circuit 104 can be commonly used.

Further, as the battery protection integrated circuit 104 includes the memory 107 in which the parameter data can be written, it is unnecessary to change a metal wiring of an IC chip, or perform laser trimming of a fuse for customizing the specification. As a result, it is possible to reduce lead time or cost of developing and manufacturing.

It is necessary to provide the terminal VPP outside of the package of the battery protection integrated circuit 104 in order to input voltage for writing parameter data in the memory 107 in a screening test for determining specification of the battery protection integrated circuit 104. After finishing the screening test, the terminal VPP is connected to the same electric potential as the terminal VSS and the terminal S1 in order to prevent accidental writing in the memory 107, as illustrated in FIG. 2.

Figure 3:
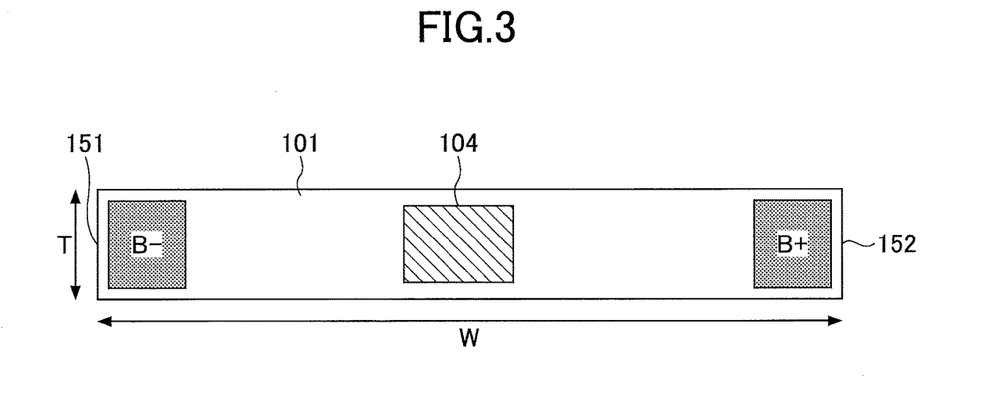
FIG. 3 is a view illustrating an example of a mounting surface of a circuit board.
Figure 4:
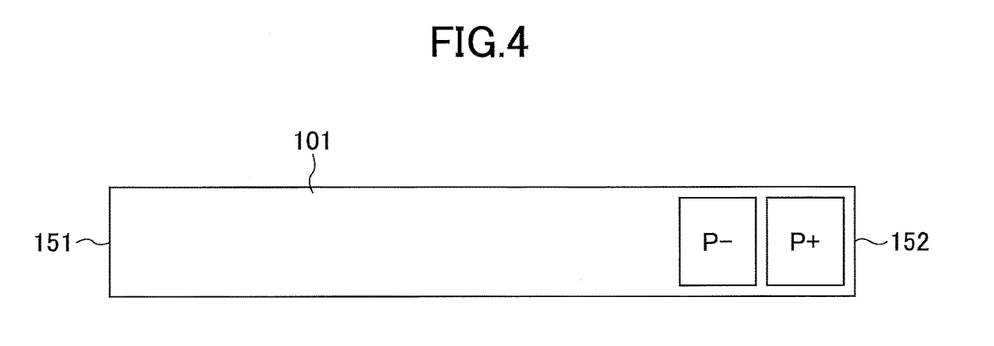
FIG. 4 is a view illustrating an example of a back surface of the circuit board.

FIG. 3 and FIG. 4 are views illustrating an outer shape of the circuit board 101 where FIG. 3 is a view illustrating a mounting surface and FIG. 4 is a view illustrating a back surface. The battery protection integrated circuit 104 is mounted on the mounting surface. The circuit board 101 may have a stacked layered structure in which conductive layers are formed at both surfaces of an insulating material substrate, for example. The circuit board 101 may have a rectangular shape where the width is longer than the thickness such as the thickness T: 2 mm to 6 mm and the width W: 25 mm to 40 mm, for example. At the mounting surface as illustrated in FIG. 3, the plus terminal (B+) and the minus terminal (B−) that correspond to the cell 103 side are formed at both end portions and the battery protection integrated circuit 104 is mounted at the center portion. Further, at the back surface as illustrated in FIG. 4, the plus terminal (P+) and the minus terminal (P−) that correspond to the battery charger 105 side are formed at the side portion where the plus terminal (B+) is provided. Here, as illustrated in FIG. 3 and FIG. 4, the plus terminal (B+) and the plus terminal (P+) are formed at substantially the same position of the mounting surface and the back surface, respectively, and are connected via a conductive material region formed in the through hole to be electrically same electric potential.

Figure 5:
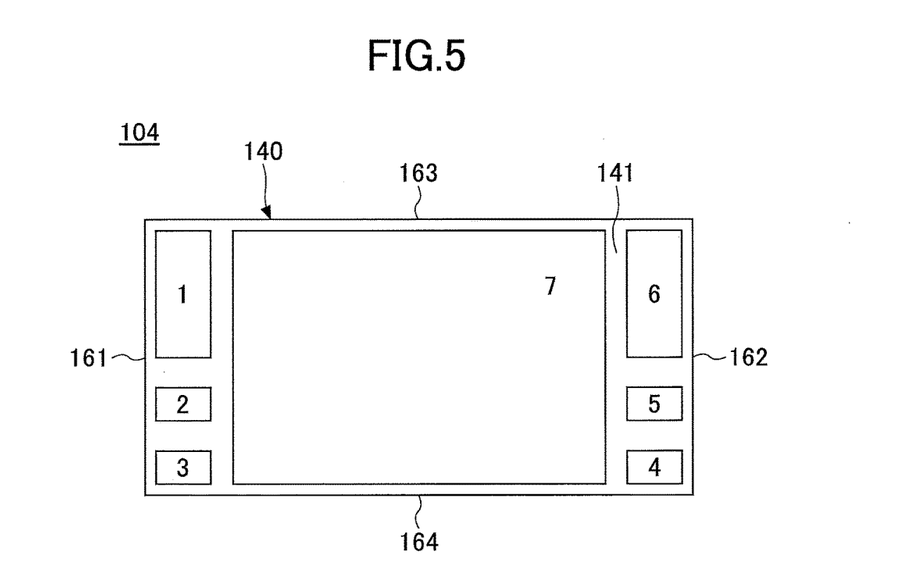
FIG. 5 is a view illustrating an example of a battery protection integrated circuit of the embodiment including external connection terminals.
Figure 6:
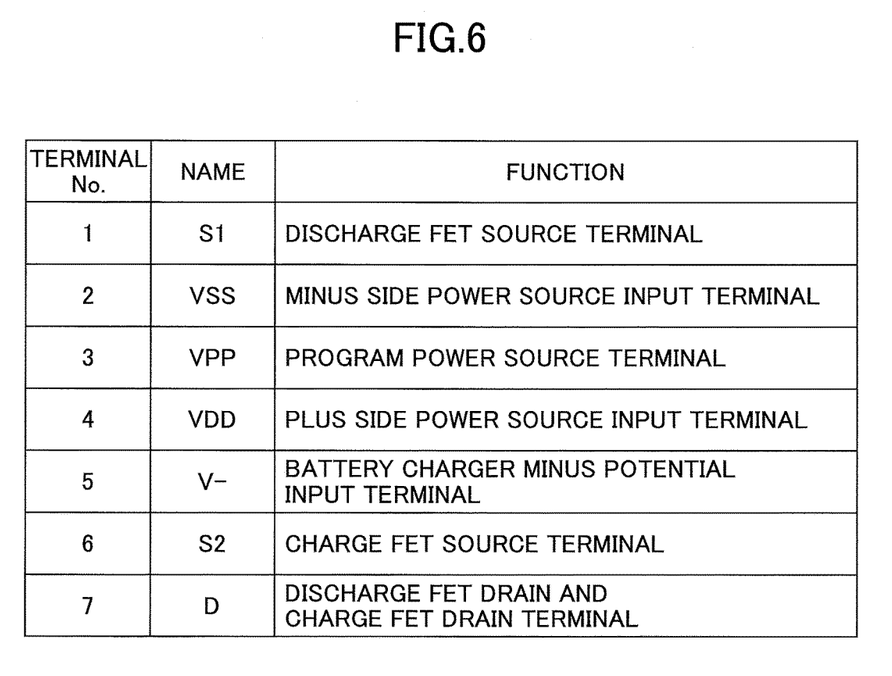
FIG. 6 is a view for explaining an example of a function of each of the external connection terminal.

FIG. 5 and FIG. 6 are views illustrating an example of a layout of the terminals of the battery protection integrated circuit 104 where FIG. 5 illustrates the layout, FIG. 6 illustrates the kinds of the terminals illustrated in FIG. 5. The battery protection integrated circuit 104 includes a package 140 having a rectangular shape in a plan view and a plurality of external connection terminals 1 to 7. The package 140 is an example of a cover member that covers the control chip CTL_CP and the FET chip FET_CP. The plurality of external connection terminals 1 to 7 are placed on a terminal providing surface 141 of the package 140 in an exposed manner. FIG. 5 transparently illustrates the plurality of external connection terminals 1 to 7 and the terminal providing surface 141 from an upper surface of the package 140 that is opposite side of the mounting surface of the circuit board 101.

The terminal providing surface 141 faces the mounting surface of the circuit board 101. Further, the terminal providing surface 141 has a rectangular shape shorter than the length of the circuit board 101 in a longitudinal direction (the width W) and the length of the circuit board 101 in a short direction (the thickness T). The terminal providing surface 141 has a pair of short sides 161 and 162 that are shorter than the thickness T of the circuit board 101 in the short direction, and a pair of long sides 163 and 164 that are shorter than the width W of the circuit board 101 in the longitudinal direction. The pair of short sides 161 and 162 face with each other in the longitudinal direction of the circuit board 101, and the pair of long sides 163 and 164 face with each other in the short direction of the circuit board 101.

The battery protection integrated circuit 104 has a structure in which the terminals 1 to 3 are provided at a short side 161 side of the terminal providing surface 141, the terminal 4 to 6 are provided at the short side 162 side of the terminal providing surface 141, and the terminal 7 is provided at a center portion of the terminal providing surface 141.

As illustrated in FIG. 6, in this embodiment, the terminal 1 corresponds to the terminal S1, the terminal 2 corresponds to the terminal VSS, the terminal 3 corresponds to the terminal VPP, the terminal 4 corresponds to the terminal VDD, the terminal 5 corresponds to the terminal V−, the terminal 6 corresponds to the terminal S2 and the terminal 7 corresponds to the terminal D. As overcurrent may flow through the terminal 1 and the terminal 6 in the charging direction or in the discharging direction of the cell 103, each of the terminal 1 and the terminal 6 is formed to an area larger than that of each of the terminals 2, 3, 4 and 5. Here, the terminal 1 or the terminal 6 may be composed by a plurality of terminals.

Figure 7:
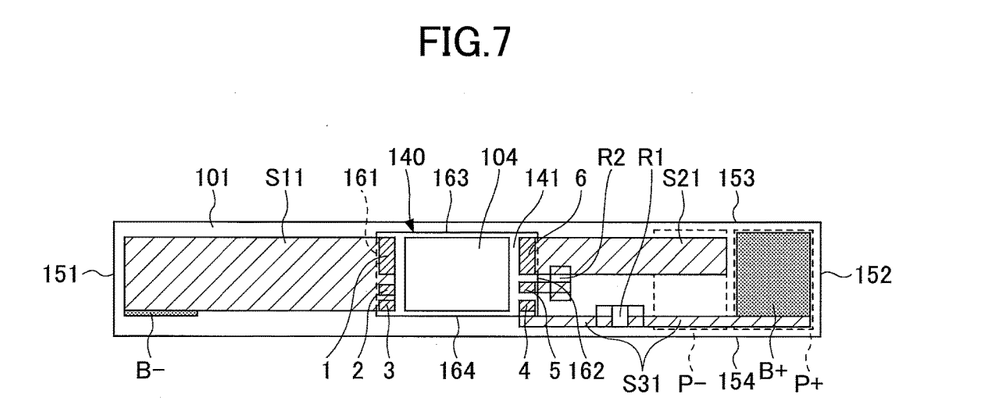
FIG. 7 is a view illustrating an example of wiring patterns when the battery protection integrated circuit of the embodiment is mounted on the circuit board.

FIG. 7 is a view illustrating an example of wiring patterns of a main part when the battery protection integrated circuit 104 illustrated in FIGS. 5 and 6 is mounted on the circuit board 101 illustrated in FIGS. 3 and 4. The circuit board 101 has a pair of board short sides 151 and 152 and a pair of board long sides 153 and 154. The circuit board 101 includes the conductive region S11 and the conductive region S21 that is provided at the mounting surface (on which the battery protection integrated circuit 104 is mounted) of the circuit board 101 which extends long and thin.

The conductive region S11 has an end connected to the minus terminal (B−) and another end connected to the terminals 1 to 3. The conductive region S11 extends in a longitudinal direction of the circuit board 101. The conductive region S21 has an end connected to the minus terminal (P−) provided at the back surface of the circuit board 101 via at least a through hole and another end connected to the terminal 6. The through hole is a conductive portion that is formed to penetrate the circuit board 101. The conductive region S21 extends in the longitudinal direction of the circuit board 101 along the board long side 153 of the circuit board 101.

In this embodiment, all of the terminals 1, 2 and 3 that are to be electrically connected to the minus terminal (B−) are provided at the short side 161 of the battery protection integrated circuit 104 that faces the board short side 151 of the circuit board 101 when the battery protection integrated circuit 104 is mounted on the circuit board 101. Further, all of the terminal 6 that is to be electrically connected to the minus terminal (P−) is provided at the short side 162 that faces the board short side 152 of the circuit board 101 when the battery protection integrated circuit 104 is mounted on the circuit board 101.

Further, the terminal 5 that is necessary to be electrically connected to the conductive region S21 via the resistance element R2 is provided at the short side 162 with which the distance between the conductive region S21 becomes the shortest, among the four sides 161 to 164, when the battery protection integrated circuit 104 is mounted on the circuit board 101. The terminal 5 is connected to the conductive region S21 that is formed on the mounting surface via the resistance element R2 that is formed on the mounting surface, on which the terminal 5 is also formed.

Further, the terminal 4 that is necessary be electrically connected to the current path between the plus terminal (B+) and the plus terminal (P+) via the resistance element R1 is provided at the short side 162 with which the distance between the current path becomes the shortest, among the four sides 161 to 164, when the battery protection integrated circuit 104 is mounted on the circuit board 101. The current path between the plus terminal (B+) and the plus terminal (P+) are provided to penetrate the circuit board 101 in its thickness direction.

Here, for the illustrated example, the terminal 4 is electrically connected to the current path between the plus terminal (B+) and the plus terminal (P+) via the resistance element R1 by being connected to the plus terminal (B+) via a conductive region S31 in which the resistance element R1 is inserted in series. The terminal 4 is connected to the plus terminal (B+) that is formed on the via the mounting surface via the resistance element R1 and the conductive region S31 formed on the mounting surface, on which the terminal 4 is also formed.

As such, the terminals 1, 2 and 3 are gathered near the short side 161 of the terminal providing surface 141, and provided at the short side 161 that is facing the board short side 151 of the circuit board 101. Thus, it is possible to form a wiring pattern of the conductive region S11 that are connected to the terminals 1, 2 and 3 on the mounting surface of the circuit board 101 toward the minus terminal (B−) without passing below the battery protection integrated circuit 104 almost not at all. Therefore, the conductive region S11 that is commonly provided for the terminals 1, 2 and 3 can have a wide width (in the thickness direction T). Therefore, as the thermal conductivity of the conductive region S11 can be prevented from being lowered, the wettability of solder between the terminals 1, 2 and 3 and the conductive region S11 can be prevented from being lowered.

Similarly, the terminal 6 is provided at the short side 162 that is facing the board short side 152 of the circuit board 101. Thus, it is possible to form a wiring pattern of the conductive region S21 that is connected to the terminal 6 on the mounting surface of the circuit board 101 toward the minus terminal (P−) without passing below the battery protection integrated circuit 104 almost not at all. Therefore, as the thermal conductivity of the conductive region S21 can be prevented from being lowered, the wettability of solder between the terminal 6 and the conductive region S21 can be prevented from being lowered.

Further, as the terminals 1 to 6 are provided at the pair of short sides 161 and 162 of the terminal providing surface 141, the wiring patterns of the conductive regions S11 and S21 that extend in the longitudinal direction of the circuit board 101 from the terminals 1 to 6, respectively, can be simplified and made widely. By simplifying the wiring patterns, it is possible to mutualize or optimize the circuit board 101, and by widening the wiring patterns, the resistances of the wiring patterns can be lowered.

Further, as the plurality of the terminals that are to be connected to the same electric potential are gathered at one of the short sides of the terminal providing surface 141, it is possible to prevent a problem caused by shortage between adjacent terminals after the battery protection integrated circuit 104 is mounted on the circuit board 101.

Further, as the terminal VPP that is used in writing data in the memory 107 can easily be electrically connected to the minus terminal (B−), accidental writing in the memory 107 can be easily prevented.

Here, the positional relationship between the three terminals 1, 2 and 3 along the short side 161 may be changed. Further, the number of the terminals that are provided along the short side 161 may be greater than or equal to two. This may be the same for the terminals provided at the short side 162 side.

According to the embodiment, lowering of wettability of solder of an external connection terminal can be suppressed.

Although a preferred embodiment of the battery protection integrated circuit, the battery protection apparatus and the battery pack has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, the battery (cell) may be a secondary cell, is not limited to the lithium-ion secondary cell, and may be another secondary cell such as a lithium-ion polymer secondary cell or the like.

What is claimed is:

1. A battery protection integrated circuit that is to be mounted on a circuit board so as to be provided between a battery and either of a battery charger and an electronic device,
the battery having a flat rectangular parallelepiped outer shape,
the circuit board having a long and thin rectangular shape corresponding to the shape of a side surface of the battery so as to be attached to the side surface of the battery,
the circuit board at least including
a first terminal connected to a minus terminal of the battery,
a second terminal connected to one terminal of either of the battery charger and the electronic device,
the battery protection integrated circuit being configured to control, when being mounted on the circuit board, current that flows between a current path of charge and discharge between the first terminal and the second terminal of the circuit board,
the battery protection integrated circuit comprising:
a switch unit that switches on and off the current path;
a control unit that monitors a status of the battery and controls on and off of the switch unit based on the monitored result;
a package that covers the switch unit and the control unit and is provided with a terminal providing surface that is configured to face the circuit board;
a plurality of external connection terminals that are electrically connected to a plurality of terminal portions of the switch unit and the control unit, respectively, and are provided to expose at the terminal providing surface of the package,
the external connection terminals including a terminal for writing data,
the package having a rectangular shape shorter than the length of the circuit board in a longitudinal direction of the circuit board and shorter than the length of the circuit board in a short direction of the circuit board,
all of the external connection terminals that are to be connected to the first terminal of the circuit board being provided at a first short side of the package at the terminal providing surface that faces one of short sides of the circuit board, and all of the external connection terminals that are to be connected to the second terminal of the circuit board being provided at a second short side of the package at the terminal providing surface that is opposite to the first short side, when being mounted on the circuit board,
wherein the control unit includes a nonvolatile memory in which data is capable of being written by writing voltage input to the terminal for writing data, the nonvolatile memory is configured to store parameter data that defines a specification of the control unit, and the control unit is configured to perform a protection operation of the battery based on the parameter data that is read from the nonvolatile memory, and
wherein the all of the external connection terminals that are to be connected to the first terminal of the circuit board includes the terminal for writing data so that the terminal for writing data is configured to be electrically connected to the minus terminal of the battery via the first terminal, when being mounted on the circuit board.

2. A battery protection apparatus comprising:
the battery protection integrated circuit of claim 1; and
the circuit board.

3. A battery pack comprising:
the battery protection apparatus of claim 2; and
the battery.

4. The battery protection integrated circuit according to claim 1,
wherein the terminal for writing data is a program power source terminal,
wherein the external connection terminals that are to be connected to the first terminal of the circuit board further include a discharge FET source terminal and a minus side power source input terminal, and
wherein the external connection terminals that are to be connected to the second terminal of the circuit board includes a plus side power source input terminal, a battery charger minus potential input terminal and a charge FET source terminal.

5. The battery protection integrated circuit according to claim 1, wherein each wiring pattern that connects the external connection terminals to each of the first and second terminals of the circuit board does not cross over the battery protection integrated circuit.

6. The battery protection apparatus according to claim 2, wherein the terminal for writing data is connected to the first terminal of the circuit board so that the terminal for writing data VPP is configured to be electrically connected to the minus terminal of the battery via the first terminal.

7. The battery protection apparatus according to claim 6, wherein the parameter data that defines the specification of the control unit of the battery protection integrated circuit is stored in the nonvolatile memory.

8. The battery protection apparatus according to claim 2,
wherein the all of the external connection terminals that are to be connected to the first terminal of the circuit board of the battery protection integrated circuit includes a minus side power source input terminal,
wherein the circuit board includes a conductive region formed at a mounting surface of the circuit board on which the battery protection integrated circuit is also mounted, and
wherein the terminal for writing data and the minus side power source input terminal of the battery protection integrated circuit are connected to the first terminal of the circuit board via the conductive region.

9. The battery protection apparatus according to claim 8,
wherein the conductive region of the circuit board has a rectangular shape whose shorter side has a same length as that of the package of the battery protection integrated circuit, and
wherein the all of the external connection terminals that are to be connected to the first terminal of the circuit board of the battery protection integrated circuit are connected to the first terminal of the circuit board via the conductive region.

10. The battery pack according to claim 3, wherein the terminal for writing data is connected to the first terminal of the circuit board so that the terminal for writing data VPP is electrically connected to the minus terminal of the battery via the first terminal.

11. The battery pack according to claim 10, wherein the parameter data that defines the specification of the control unit of the battery protection integrated circuit is stored in the nonvolatile memory.

12. The battery pack according to claim 3,
wherein the all of the external connection terminals that are to be connected to the first terminal of the circuit board of the battery protection integrated circuit includes a minus side power source input terminal,
wherein the circuit board includes a conductive region formed at a mounting surface of the circuit board on which the battery protection integrated circuit is also mounted, and
wherein the terminal for writing data and the minus side power source input terminal of the battery protection integrated circuit are connected to the first terminal of the circuit board via the conductive region.

13. The battery pack according to claim 12,
wherein the conductive region of the circuit board has a rectangular shape whose shorter side has a same length as that of the package of the battery protection integrated circuit, and
wherein the all of the external connection terminals that are to be connected to the first terminal of the circuit board of the battery protection integrated circuit are connected to the first terminal of the circuit board via the conductive region.

14. The battery protection integrated circuit according to claim 1,
wherein the control unit is configured to perform a protection operation of the battery based on the parameter data that is previously stored in the nonvolatile memory and read from the nonvolatile memory.

* * * * *